(12) United States Patent
Su et al.

(10) Patent No.: US 12,100,639 B2
(45) Date of Patent: Sep. 24, 2024

(54) CHIP HEAT DISSIPATION STRUCTURE, CHIP STRUCTURE, CIRCUIT BOARD AND SUPERCOMPUTING DEVICE

(71) Applicant: Bitmain Technologies Inc., Beijing (CN)

(72) Inventors: Dan Su, Beijing (CN); Yonggang Sun, Beijing (CN); Micree Zhan, Beijing (CN); Tao Zhou, Beijing (CN)

(73) Assignee: Bitmain Technologies Inc., Beijing (CN)

( * ) Notice: Subject to any disclaimer, the term of this patent is extended or adjusted under 35 U.S.C. 154(b) by 720 days.

(21) Appl. No.: 17/327,053

(22) Filed: May 21, 2021

(65) Prior Publication Data

US 2021/0280493 A1 Sep. 9, 2021

Related U.S. Application Data

(63) Continuation of application No. PCT/CN2018/117240, filed on Nov. 23, 2018.

(51) Int. Cl.
*H01L 23/29* (2006.01)
*H01L 23/367* (2006.01)
(Continued)

(52) U.S. Cl.
CPC ........ *H01L 23/3735* (2013.01); *H01L 23/293* (2013.01); *H01L 23/367* (2013.01); *H05K 1/0209* (2013.01)

(58) Field of Classification Search
CPC ........... H01L 23/3735; H01L 2924/351; H01L 23/4334; H01L 23/3677; H05K 1/0204; H05K 1/0203; H05K 7/209
See application file for complete search history.

(56) References Cited

U.S. PATENT DOCUMENTS

| 6,724,078 B1 * | 4/2004 | Sur | H01L 23/42 |
| | | | 257/E23.09 |
| 7,347,354 B2 * | 3/2008 | Hurley | B23K 31/02 |
| | | | 228/221 |

(Continued)

FOREIGN PATENT DOCUMENTS

| CN | 1599955 A | 3/2005 |
| CN | 101509649 A | 8/2009 |
| CN | 103137831 A | 6/2013 |

OTHER PUBLICATIONS

Internatonal Search Report dated Feb. 27, 2019 for PCT application No. PCT/CN2018/117240.

*Primary Examiner* — Jaehwan Oh

(57) ABSTRACT

Embodiments of the present application relates to a chip heat dissipation structure, a chip structure, a circuit board, and a supercomputing device, and the chip heat dissipation structure includes: a plating layer covering a wafer of the chip; where the plating layer includes a first metal layer, a second metal layer, and a third metal layer sequentially arranged. Three metal layers are added on a top of the chip by physical sputtering, so that a heat sink can be welded on the metal layers by a solder layer, and then the heat sink is fixed on the top of the chip; a main component of the solder layer is metal tin, and the metal layer have a higher thermal conductivity than an epoxy adhesive material mounted on a conventional heat sink.

17 Claims, 15 Drawing Sheets

(51) Int. Cl.
*H01L 23/373* (2006.01)
*H05K 1/02* (2006.01)

(56) References Cited

U.S. PATENT DOCUMENTS

| | | | |
|---|---|---|---|
| 9,142,480 B2 * | 9/2015 | Houle | H01L 23/24 |
| 2002/0105071 A1 * | 8/2002 | Mahajan | H01L 23/36 |
| | | | 257/E23.101 |
| 2003/0057550 A1 * | 3/2003 | Zhao | H01L 23/49833 |
| | | | 257/734 |
| 2005/0136640 A1 * | 6/2005 | Hu | H01L 23/373 |
| | | | 257/E23.102 |
| 2006/0131738 A1 * | 6/2006 | Furman | H01L 23/3737 |
| | | | 257/E23.087 |
| 2007/0075420 A1 * | 4/2007 | Lu | H01L 24/83 |
| | | | 257/E23.106 |
| 2007/0238282 A1 * | 10/2007 | Furman | H01L 21/4882 |
| | | | 438/612 |
| 2009/0057877 A1 * | 3/2009 | Touzelbaev | H01L 21/50 |
| | | | 257/706 |
| 2010/0157538 A1 * | 6/2010 | Wang | H01L 23/3737 |
| | | | 165/185 |
| 2010/0302739 A1 * | 12/2010 | Wang | H01L 24/83 |
| | | | 428/323 |
| 2016/0225704 A1 * | 8/2016 | Cao | H01L 23/49537 |
| 2017/0186665 A1 * | 6/2017 | Choudhury | H01L 23/433 |
| 2018/0190566 A1 * | 7/2018 | Fu | H01L 23/3736 |

\* cited by examiner

CHIP HEAT DISSIPATION STRUCTURE, CHIP STRUCTURE, CIRCUIT BOARD AND SUPERCOMPUTING DEVICE

CROSS-REFERENCE TO RELATED APPLICATIONS

This application is a continuation of International Application No. PCT/CN2018/117240, filed on Nov. 23, 2018, the disclosure of which is hereby incorporated by reference in its entirety.

TECHNICAL FIELD

The present application relates to the field of chip heat dissipation, in particular to a chip heat dissipation structure, a chip structure, a circuit board, and a supercomputing device.

BACKGROUND

In an existing computing device, thermal grease is usually used to paste a heat sink on a top of a chip to perform heat dissipation of the chip on the circuit board.

However, a thermal conductivity of conventional thermal grease is generally lower than 2 W/m degrees (W/(m·C)), which leads to unsatisfactory heat dissipation effect of the chip.

SUMMARY

The present application provides a chip heat dissipation structure, a chip structure, a circuit board, and a supercomputing device to solve a problem that heat dissipation effect of an existing chip is unsatisfactory.

An embodiment of the present application provides a chip heat dissipation structure which is arranged on a chip, and the chip heat dissipation structure includes a plating layer covering a wafer of the chip;

where the plating layer includes a first metal layer, a second metal layer, and a third metal layer sequentially arranged.

Further, the chip heat dissipation structure further includes a heat sink connected with the plating layer.

Further, the first metal layer covers the wafer, the second metal layer covers the first metal layer, and the third metal layer covers the second metal layer.

Further, the chip includes the wafer and a plastic package structure, and an upper surface of the wafer is exposed.

Further, an area of the plating layer is the same as an area of the upper surface of the wafer.

Further, the first metal layer is a titanium metal layer.

Further, a thickness of the first metal layer is 1000 angstroms.

Further, the second metal layer is a nickel-vanadium alloy metal layer.

Further, a thickness of the second metal layer is 3500 angstroms.

Further, the third metal layer is made of gold.

Further, a thickness of the third metal layer is 1000 angstroms.

Further, areas of the first metal layer, the second metal layer, and the third metal layer are the same.

Further, the heat sink is welded on the plating layer through a solder layer.

Further, solder in the solder layer is tin.

Further, a thickness of the solder layer is 0.1 to 0.15 mm.

Further, an area of the solder layer is the same as an area of the plating layer, or the area of the solder layer is the same as an area of a lower surface of the heat sink.

Further, an upper surface of the plating layer is flush with an upper surface of the plastic package structure, or a lower surface of the plating layer is flush with the upper surface of the plastic package structure.

An embodiment of the present application further provides a chip structure, including a chip body and the chip heat dissipation structure according to any one described above, which is arranged on the chip body.

An embodiment of the present application further provides a circuit board provided with at least one chip structure described above.

An embodiment of the present application further provides a supercomputing device provided with at least one circuit board described above.

In above aspects, a chip heat dissipation structure composed of a plating layer is provided, the chip heat dissipation structure is arranged on a chip, the plating layer covers a wafer of the chip, and a heat sink is connected with the plating layer; where the plating layer includes a first metal layer, a second metal layer, and a third metal layer sequentially arranged; in addition, the heat sink may be connected with the plating layer. Three metal layers are added on a top of the chip by physical sputtering, so that the heat sink can be welded on the metal layers by a solder layer, and then the heat sink is fixed on the top of the chip; a main component of the solder layer is metal tin, and the metal layer have a higher thermal conductivity than an epoxy adhesive material mounted on a conventional heat sink, which solves a problem of a bottleneck of heat dissipation of the adhesive material in the chip; and heat dissipation effect of the chip can be improved and a large amount of heat can be prevented from damaging the chip.

BRIEF DESCRIPTION OF DRAWINGS

One or more embodiments are illustrated by corresponding drawings, which do not constitute a limitation on the embodiments. Elements with a same reference numeral in the drawings are shown as similar elements, and the drawings do not constitute a scale limitation, and wherein.

| Reference signs: | | |
|---|---|---|
| 1-Plating layer | 2-Heat sink | 3-First metal layer |
| 4-Second metal layer | 5-Third metal layer | 6-Bottom sheet |
| 7-Fin | 8-Connecting part | 9-Wafer |
| 10-Solder layer | 11-Plastic package structure | 12-Substrate |
| 13-Tin ball | 14-Circuit board | |

DESCRIPTION OF EMBODIMENTS

Embodiments of the present application are applied to a chip. It should be noted that when a solution of an embodiment of the present application is applied to a current chip or a chip that may appear in the future, a name of each structure may change, but this does not affect an implementation of the solution of the embodiment of the present application.

It should be noted that a noun or a term involved in the embodiments of the present application may be cross-referenced and will not be described in detail.

In the prior art, a die-exposed package on a wafer means exposing the wafer so as to achieve a better heat dissipation, where a silicon wafer may be simply referred to as a wafer. Conventional thermal grease is used to paste a heat sink on a top of a chip at the same time of the die-exposed package, but a thermal conductivity of the conventional thermal grease is generally lower than 2 W/(m·C), which leads to poor heat dissipation effect of the chip and becomes a bottleneck of systematic heat dissipation. In order to achieve a better heat dissipation effect, solder with high thermal conductivity has become an ideal substitute material for the thermal grease. Thermal conductivity of the solder is higher than 60 W/(m·C), which can greatly improve the heat dissipation efficiency of the chip. However, the solder can't be welded well to a plastic package structure of the wafer and the chip.

A chip heat dissipation structure, a chip structure, a circuit board, and a supercomputing device provided by the present application aiming to solve the above technical problem in the prior art.

In order to understand characteristics and technical contents of the embodiments of the present application in more detail, implementations of the embodiments of the present application will be described in detail in conjunction with the drawings, and the drawings are for reference only and are not used to limit the embodiments of the present application. In the following technical descriptions, for convenience of explanation, a plurality of details is provided in order to provide a thorough understanding of the disclosed embodiments. However, one or more embodiments may still be implemented without these details. In other cases, in order to simplify the drawings, a well-known structure and device may be displayed simplistically.

Figure 1:
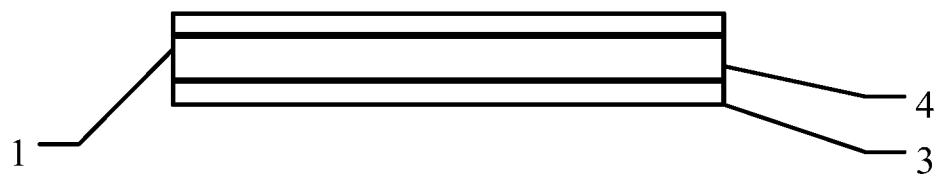
FIG. 1 is a first structural schematic diagram of a chip heat dissipation structure provided by an embodiment of the present application.
Figure 2:
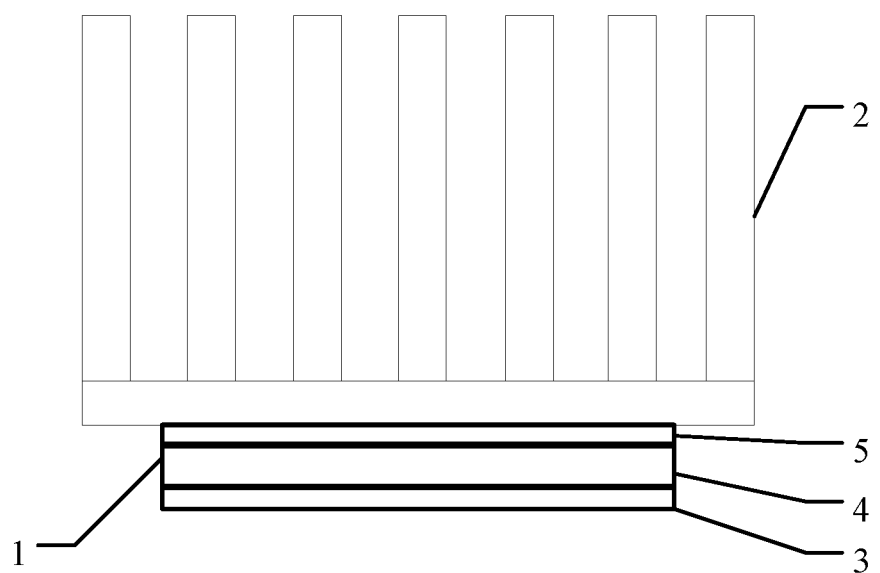
FIG. 2 is a second structural schematic diagram of the chip heat dissipation structure provided by the embodiment of the present application.
Figure 3:
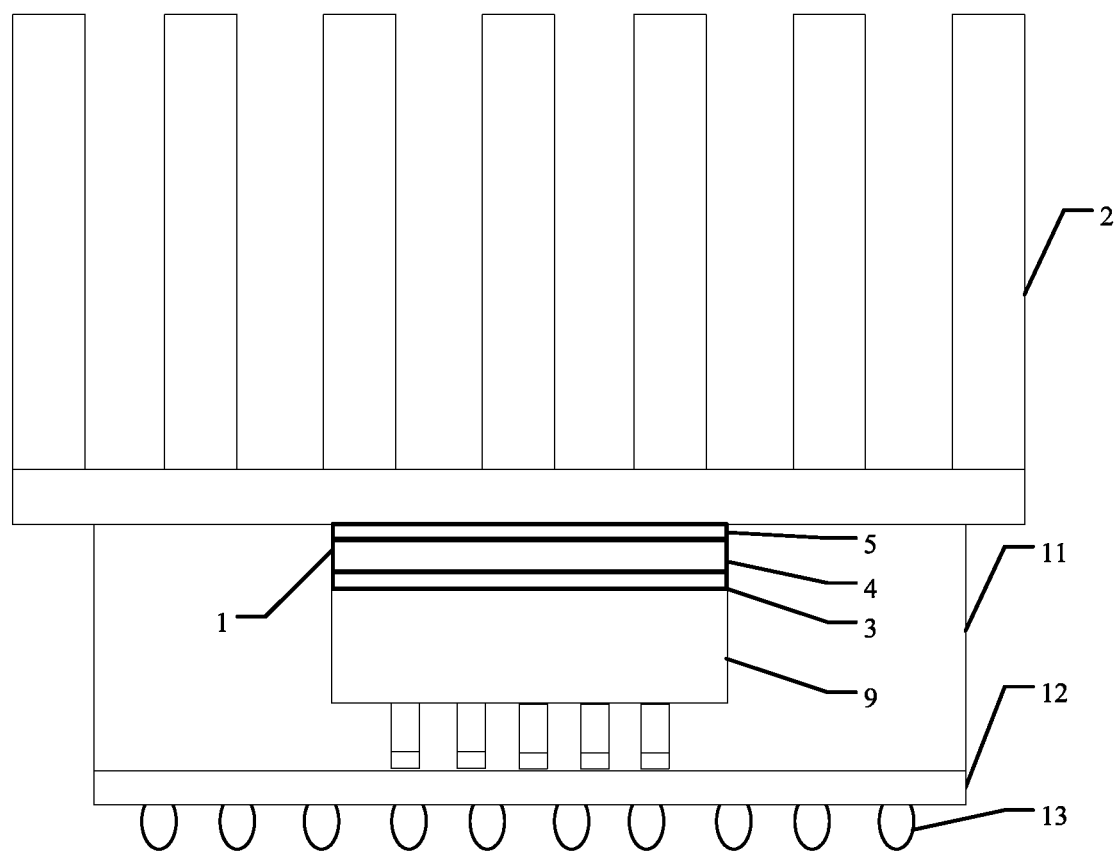
FIG. 3 is a third structural schematic diagram of the chip heat dissipation structure provided by the embodiment of the present application.

FIG. 1 is a first structural schematic diagram of a chip heat dissipation structure provided by an embodiment of the present application; FIG. 2 is a second structural schematic diagram of the chip heat dissipation structure provided by the embodiment of the present application; and FIG. 3 is a third structural schematic diagram of the chip heat dissipation structure provided by the embodiment of the present application. As shown in FIGS. 1 to 3, the chip heat dissipation structure is arranged on a chip, and the chip heat dissipation structure includes a plating layer 1 covering a wafer 9 of the chip; where, the plating layer 1 includes a first metal layer 3, a second metal layer 4, and a third metal layer 5 sequentially arranged.

Exemplarily, the chip heat dissipation structure provided by the present application may be arranged on a chip. The chip includes a wafer 9, a plastic package structure 11, and a substrate 12; a groove is formed in the plastic packaging structure 11, the wafer 9 may be arranged in the groove, then the plastic package structure 11 encapsulates the wafer 9, and a upper surface of the wafer 9 is exposed, i.e., is an die-exposed structure; the plastic package structure 11 is fixedly arranged on one side of the substrate 12; in addition, at least one solder ball 13 may be arranged on the other side of the substrate 12, and the solder ball 13 is used to connect with a circuit board, thereby fixing the chip on the circuit board.

As mentioned above, since the solder can't be weld well with the wafer 9, in the present application, by covering the wafer 9 with a plating layer 1, the chip and an external heat sink 2 are connected by welding.

A shape of the wafer 9 may be round, rectangular, square, trapezoidal, or other regular or irregular shapes; and a shape of the wafer 9 is not limited in the present application, and a material of the wafer 9 is not limited in the present application.

A shape of the plastic package structure 11 is not limited in the present application, as long as the plastic package structure 11 can perform a plastic package on the wafer 9. A material of the plastic package structure 11 is not limited in the present application.

The plating layer 1 includes a first metal layer 3, a second metal layer 4, and a third metal layer 5 sequentially arranged; and materials used for the first metal layer 3, the second metal layer 4, and the third metal layer 5 are different, thicknesses of the first metal layer 3, the second metal layer 4, and the third metal layer 5 may be the same or different from each other; and areas of the first metal layer 3, the second metal layer 4, and the third metal layer 5 may be the same or different from each other.

Optionally, the plating layer 1 may be grid-shaped, i.e., the first metal layer 3 is grid-shaped, the second metal layer 4 is grid-shaped, and the third metal layer 5 is grid-shaped, which can save a cost of the plating layer 1.

In another implementation, the chip heat dissipation structure further comprises a heat sink 2, where the plating layer 1 covers the chip, i.e., the plating layer 1 covers the wafer 9; and the heat sink 2 is connected with the plating layer 1. The heat sink 2 and the plating layer 1 are connected by welding.

A shape and a size of the heat sink 2 are not limited in the present application.

Figure 4:
FIG. 4 is a first structural schematic diagram of a heat sink provided by an embodiment of the present application.

For example, FIG. 4 is a first structural schematic diagram of a heat sink provided by an embodiment of the present application. As shown in FIG. 4, the heat sink 2 is composed of a bottom sheet 6 and at least one fin 7, each fin 7 is fixedly connected with the bottom plate 6, and the bottom plate 6 is welded with a surface of the plating layer 1.

Figure 5:
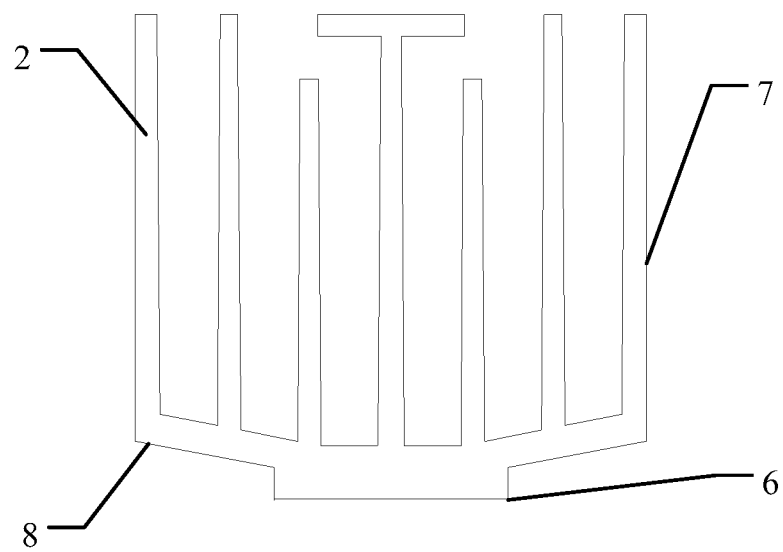
FIG. 5 is a second structural schematic diagram of the heat sink provided by the embodiment of the present application.

For another example, FIG. 5 is a second structural schematic diagram of the heat sink provided by the embodiment of the present application. As shown in FIG. 5, the heat sink 2 may also be provided with a connecting part 8, the connecting part is composed of a first plate and a second plate, and a preset angle exists between the first plate and the second plate, the preset angle may have a range of 180 degrees to 90 degrees; furthermore, each fin 7 is fixedly arranged on an upper surface of the connecting part 8, and a bottom plate 6 is fixedly arranged on a lower surface of the connecting part 8; in addition, a gripper may be arranged on one of the fins 7 in the heat sink 2.

In the present embodiment, a chip heat dissipation structure composed of a plating layer 1 is provided, the chip heat dissipation structure is arranged on a chip, the plating layer 1 covers a wafer 9 of the chip, and a heat sink 2 is connected with the plating layer 1; where the plating layer 1 includes a first metal layer 3, a second metal layer 5, and a third metal layer 5 sequentially arranged; in addition, the heat sink 2 may be connected with the plating layer 1. Three metal layers are added on a top of the chip by physical sputtering, so that the heat sink 2 can be welded on the metal layers by a solder layer, and then the heat sink 2 is fixed on the top of the chip; a main component of the solder layer is metal tin, and the metal layer have a higher thermal conductivity than an epoxy adhesive material mounted on a conventional heat sink, which solves a problem of a bottleneck of heat dissipation of the adhesive material in the chip; and heat dissipation effect of the chip can be improved and a large amount of heat can be prevented from damaging the chip.

Figure 6:
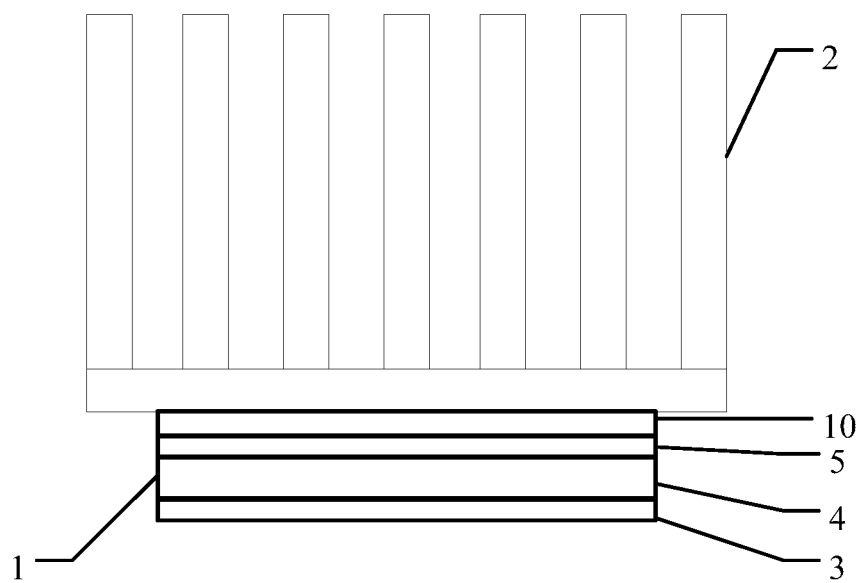
FIG. 6 is a first structural schematic diagram of another chip heat dissipation structure provided by an embodiment of the present application.
Figure 7:
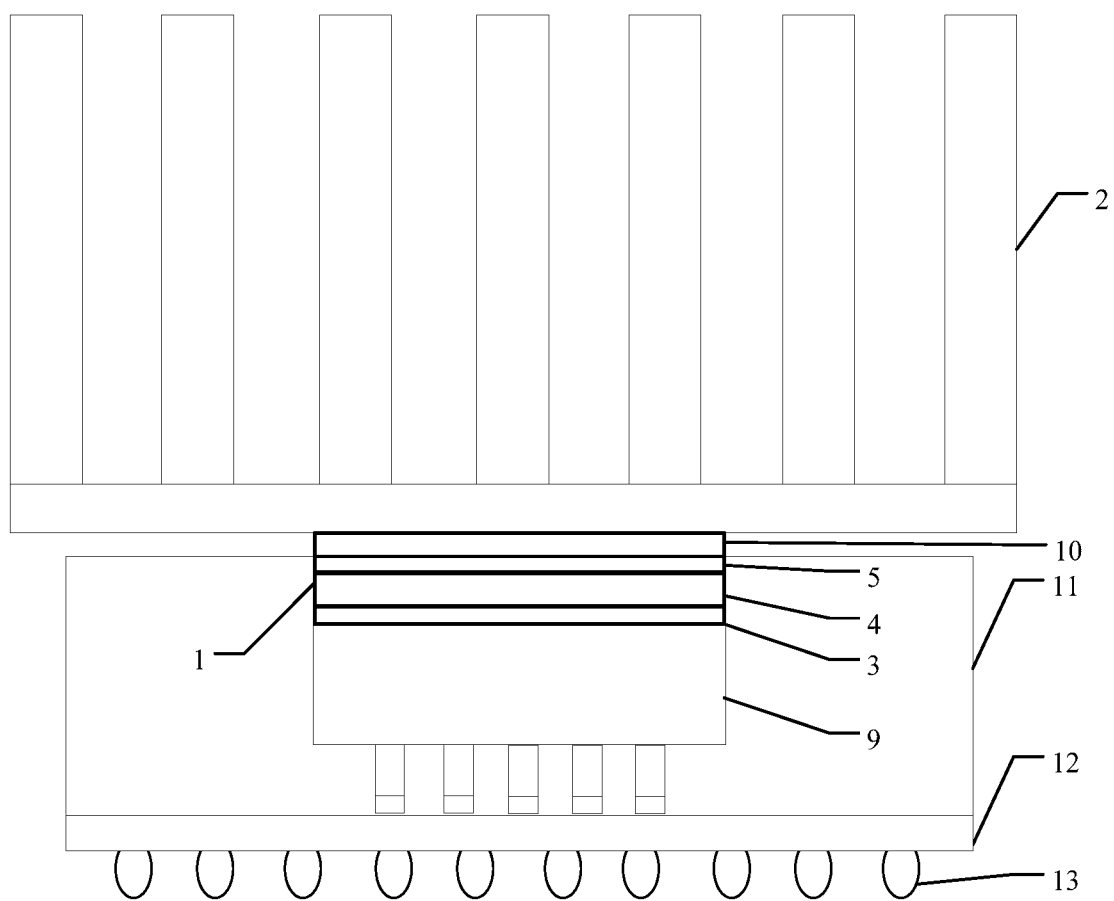
FIG. 7 is a second structural schematic diagram of another chip heat dissipation structure provided by the embodiment of the present application.

FIG. 6 is a first structural schematic diagram of another chip heat dissipation structure provided by an embodiment of the present application; and FIG. 7 is a second structural schematic diagram of another chip heat dissipation structure provided by the embodiment of the present application. On the basis of the embodiment shown in FIG. 1, as shown in FIGS. 6 and 7, the first metal layer 3 covers the wafer 9, the second metal layer 4 covers the first metal layer 3, and the third metal layer 5 covers the second metal layer 4.

Optionally, an area of a plating layer 1 is the same as an area of an upper surface of the wafer 9.

Optionally, the first metal layer 3 is a titanium metal layer. A thickness of the first metal layer 3 is 1000 angstroms.

Optionally, the second metal layer 4 is a nickel-vanadium alloy metal layer. A thickness of the second metal layer 4 is 3500 angstroms.

Optionally, the third metal layer 5 is made of gold. A thickness of the third metal layer 5 is 1000 angstroms.

Optionally, areas of the first metal layer 3, the second metal layer 4, and the third metal layer 5 are the same.

Optionally, the heat sink 2 is welded on the plating layer 1 through a solder layer 10. Solder in the solder layer 10 is tin. A thickness of the solder layer 10 is 0.1 to 0.15 mm.

Optionally, an area of the solder layer 10 is the same as an area of the plating layer 1, or the area of the solder layer 10 is the same as an area of a lower surface of the heat sink 2.

Optionally, an upper surface of the plating layer 1 is flush with an upper surface of the plastic package structure 11, or a lower surface of the plating layer 1 is flush with the upper surface of the plastic package structure 11.

Exemplarily, on the basis of the embodiment shown in FIG. 1, the first metal layer 3 is covered on an upper surface of the wafer 9, the second metal layer 4 is covered on an upper surface of the first metal layer 3, and the third metal layer 5 is covered on an upper surface of the second metal layer 4.

In the present embodiment, a material of the first metal layer 3 is titanium (Ti), i.e., the first metal layer 3 is a titanium metal layer; a material of the second metal layer 4 is nickel vanadium alloy (NiV), i.e., the second metal layer 4 is a nickel vanadium alloy metal layer; and a material of the third metal layer 5 is gold (Au). Therefore, the titanium metal layer covers the upper surface of the wafer 9; the nickel-vanadium alloy covers an upper surface of the titanium metal layer, and a gold metal layer of gold covers an upper surface of the nickel-vanadium alloy metal layer.

In order to facilitate a connection of the three metal layers with the chip and the heat sink 2, as well as heat conduction and heat dissipation of the chip by the three metal layers, thicknesses of the three metal layers may be set with the following parameters: a thickness of the first metal layer is 1000 angstroms; a thickness of the second metal layer is 3500 angstroms; and a thickness of the third metal layer is 1000 angstroms.

In the present embodiment, a solder layer is arranged on the plating layer 1, i.e., a solder layer 10 is arranged on the third metal layer 5; and the heat sink 2 is welded to the solder layer 10. A material of the solder layer 10 is tin. Optionally, a thickness of the solder layer 10 is 0.1 to 0.15 mm; preferably, the thickness of the solder layer 10 is 0.13 mm. A thermal conductivity of the solder layer 10 is higher than 60 W/(m·C), which can improve heat dissipation effect of the chip.

Figure 8:
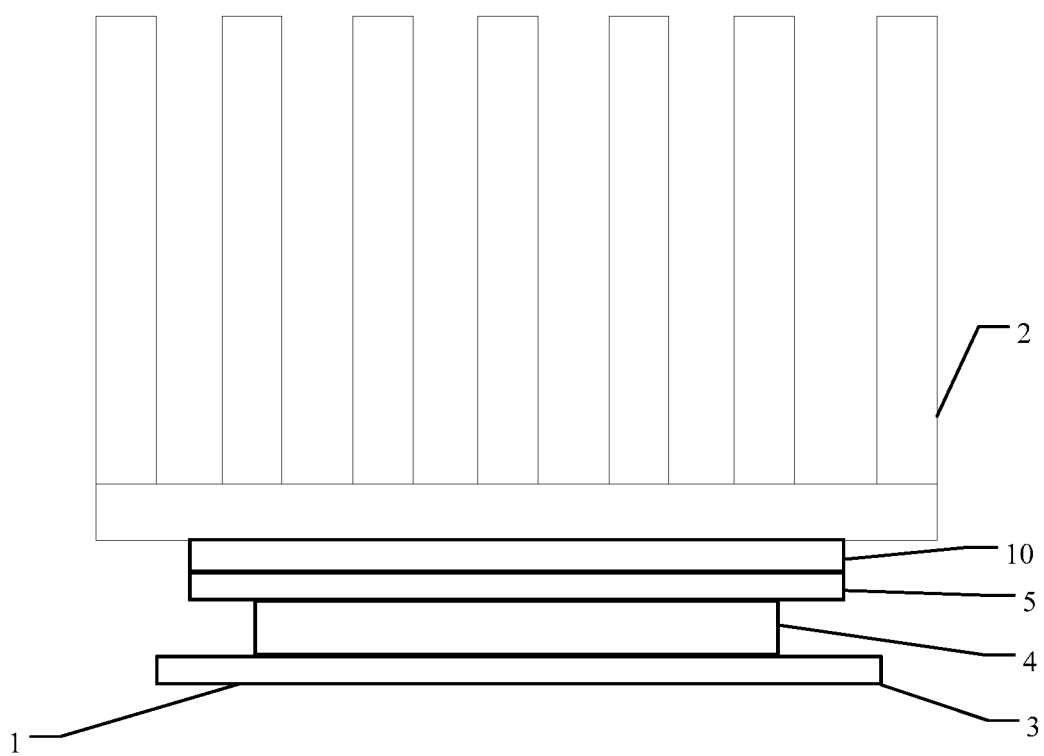
FIG. 8 is a third structural schematic diagram of another chip heat dissipation structure provided by the embodiment of the present application.
Figure 9:
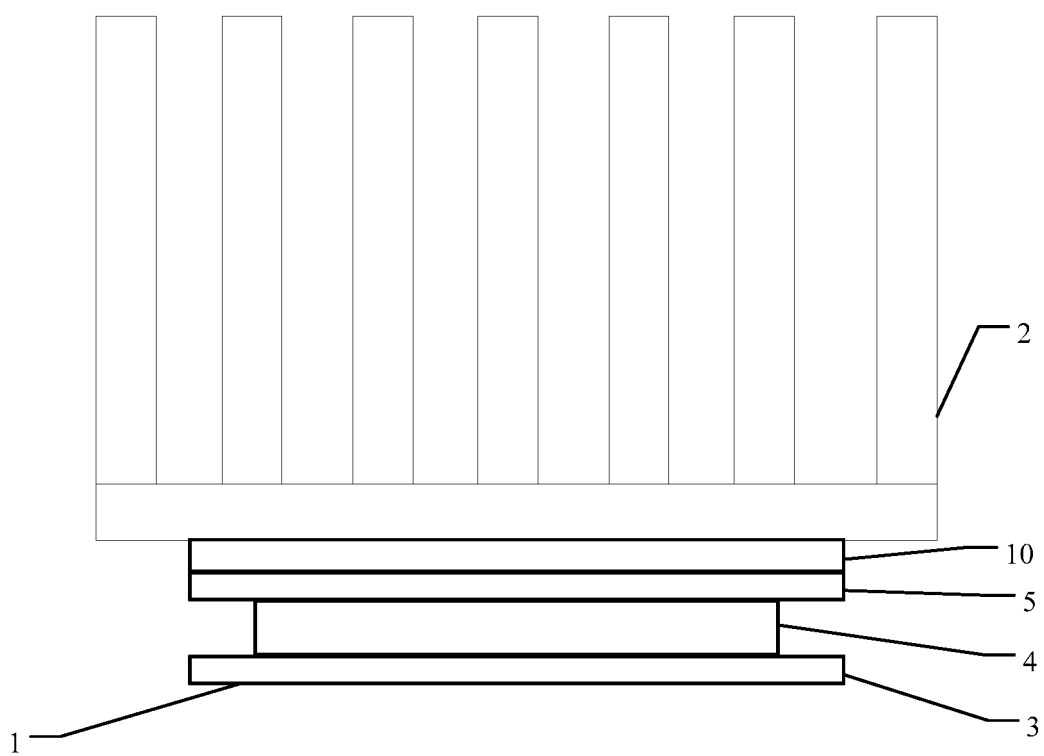
FIG. 9 is a fourth structural schematic diagram of another chip heat dissipation structure provided by the embodiment of the present application.

In the present embodiment, the area of the plating layer 1 is the same as the area of the upper surface of the wafer 9. At this time, the area of the first metal layer 3 is the same as the area of the upper surface of the wafer 9. As shown in FIG. 6, the areas of the first metal layer 3, the second metal layer 4, and the third metal layer 5 are the same. Or, FIG. 8 is a third structural schematic diagram of another chip heat dissipation structure provided by the embodiment of the present application. As shown in FIG. 8, the area of the first metal layer 3, the area of the second metal layer 4, and the area of the third metal layer 5 are different from each other. Or, FIG. 9 is a fourth structural schematic diagram of another chip heat dissipation structure provided by the embodiment of the present application. As shown in FIG. 9, in the areas of the first metal layer 3, the second metal layer 4 and the third metal layer 5, some are the same while some are different. For example, the areas of the first metal layer 3 and the third metal layer 5 are the same while the areas of the first metal layer 3 and the second metal layer 4 are different.

In the present embodiment, the area of the solder layer 10 is provided in the following ways.

A first implementation for the area of the solder layer 10: as shown in FIG. 7, the areas of the first metal layer 3, the second metal layer 4, and the third metal layer 5 are the same, and the area of the solder layer 10 is the same as the area of the plating layer 1, and the area of the plating layer 1 is the same as the area of the upper surface of the wafer 9.

Figure 10:
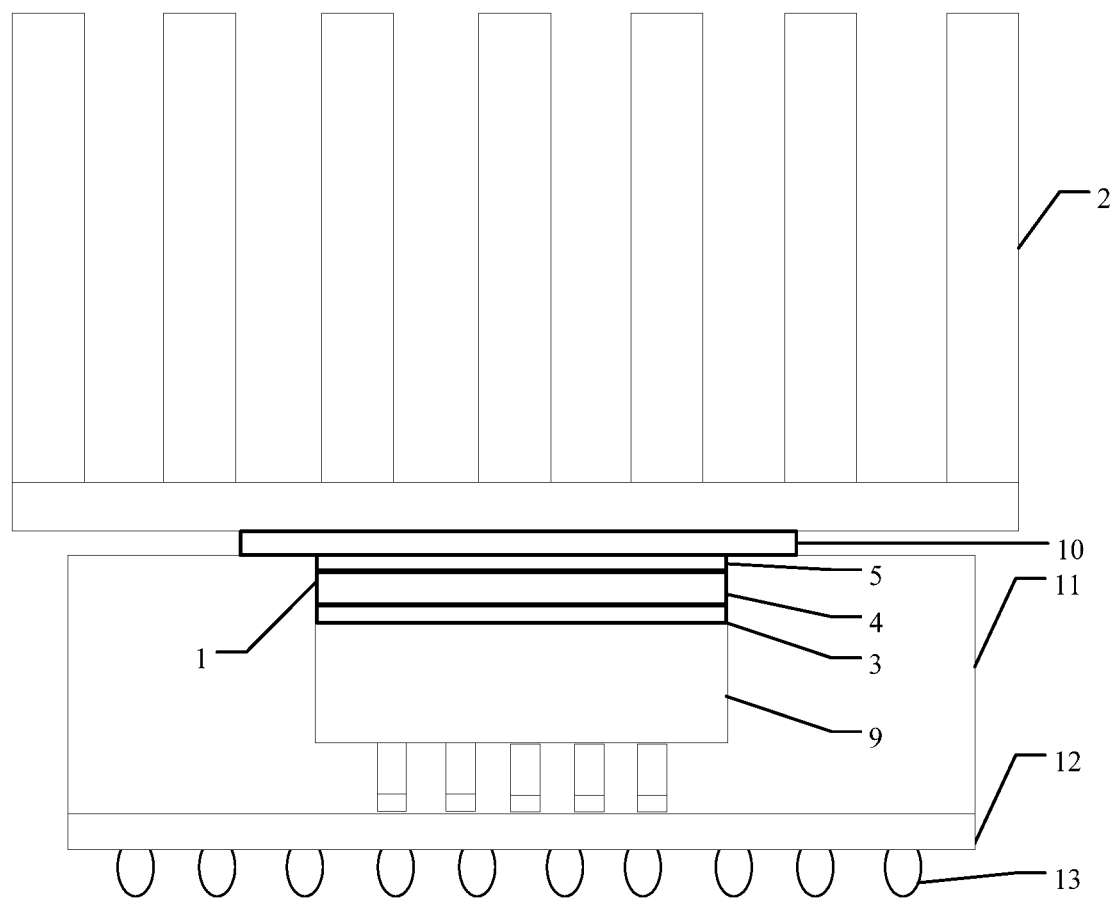
FIG. 10 is a fifth structural schematic diagram of another chip heat dissipation structure provided by the embodiment of the present application.

A second implementation for the area of the solder layer 10: FIG. 10 is a fifth structural schematic diagram of another chip heat dissipation structure provided by the embodiment of the present application. As shown in FIG. 10, the areas of first metal layer 3, second metal layer 4, and third metal layer 5 are the same, and the area of the solder layer 10 is different from the area of the plating layer 1, for example, the area of the solder layer 10 is larger than the area of the plating layer 1; and the area of the plating layer 1 is the same as the area of the upper surface of the wafer 9.

Figure 11:
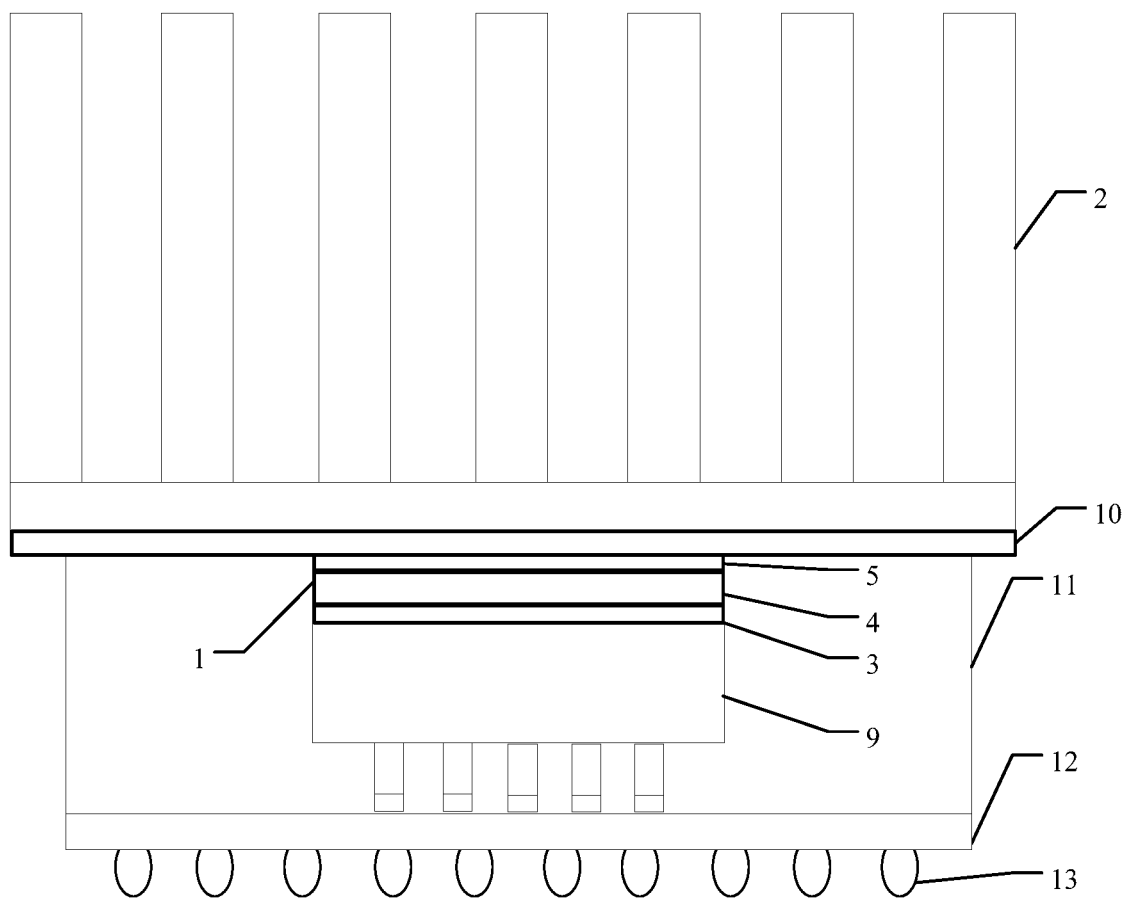
FIG. 11 is a sixth structural schematic diagram of another chip heat dissipation structure provided by the embodiment of the present application.

A third implementation for the area of the solder layer 10: FIG. 11 is a sixth structural schematic diagram of another chip heat dissipation structure provided by the embodiment of the present application. As shown in FIG. 11, the areas of the first metal layer 3, the second metal layer 4 and the third metal layer 5 are the same, and the area of the solder layer 10 is the same as the area of the lower surface of the heat sink 2; where the area of the solder layer 10 is different from the area of the plating layer 1, and the area of the plating layer 1 is the same as the area of the upper surface of the wafer 9. The area of the solder layer 10 is the same as the area of a bottom surface of the heat sink 2, which is beneficial to a good connection between the heat sink 2 and the solder layer 10.

Figure 12:
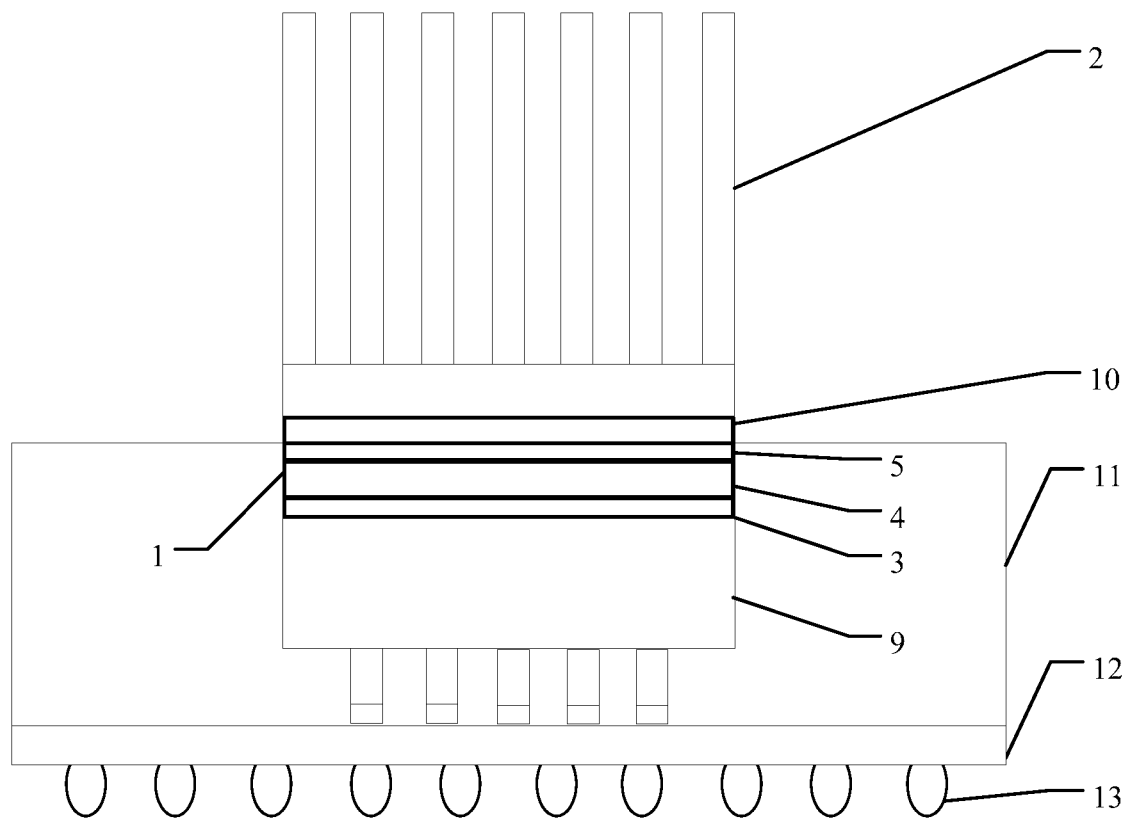
FIG. 12 is a seventh structural schematic diagram of another chip heat dissipation structure provided by the embodiment of the present application.

A fourth implementation for the area of the solder layer 10: FIG. 12 is a seventh structural schematic diagram 7 of another chip heat dissipation structure provided by the embodiment of the present application. As shown in FIG. 12, the areas of the first metal layer 3, the second metal layer 4, and the third metal layer 5 are the same, and the area of the solder layer 10 is the same as the area of the lower surface of the heat sink 2; where the area of the solder layer 10 is the same as the area of the plating layer 1, and the area of the plating layer 1 is the same as the area of the upper surface of the wafer 9.

A fifth implementation for the area of the solder layer 10: when the area of the solder layer 10 is the same as the area of the lower surface of the heat sink 2, the areas of the first metal layer 3, the second metal layer 4, and the third metal layer 5 may be all the same or partially the same.

A positional relationship between the plating layer 1 and the plastic package structure 11 includes the following implementations.

Figure 13:
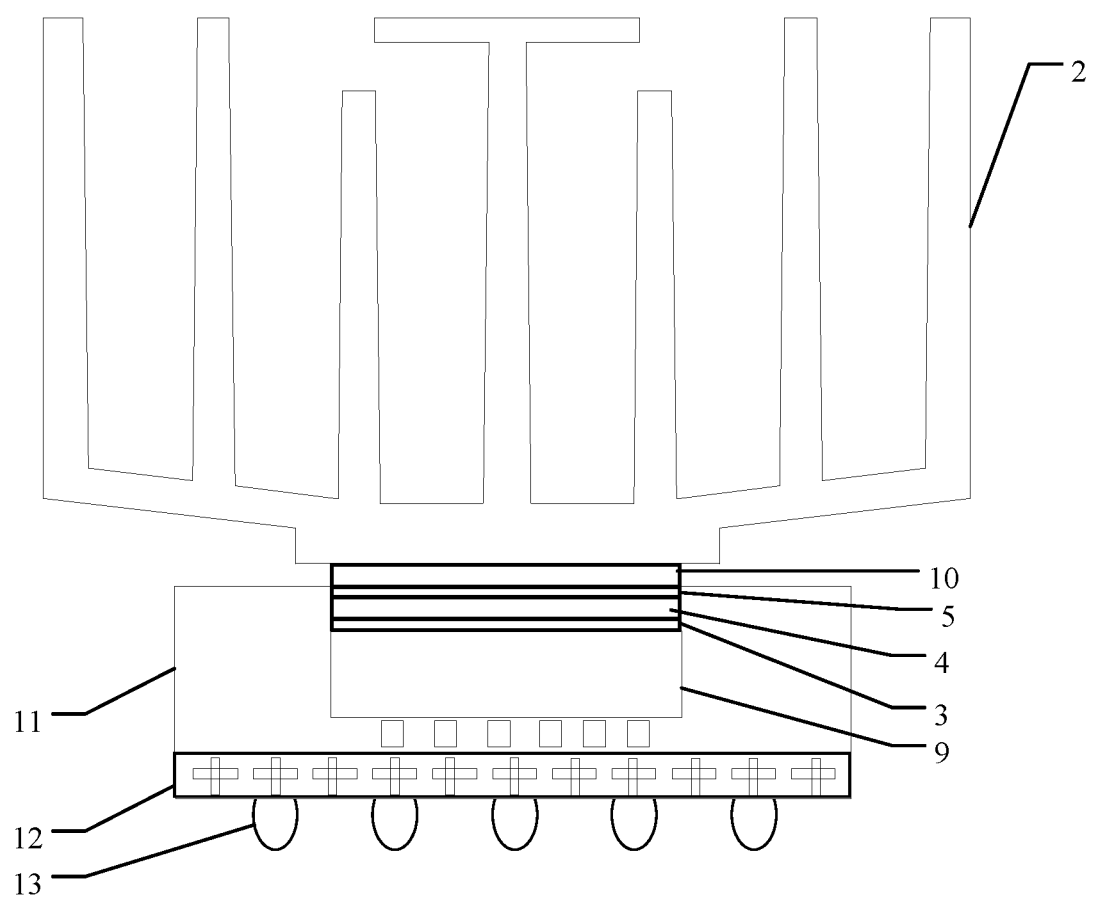
FIG. 13 is an eighth structural schematic diagram of another chip heat dissipation structure provided by the embodiment of the present application.

A first implementation for the positional relationship between the plating layer 1 and the plastic package structure 11: FIG. 13 is an eighth structural schematic diagram of another chip heat dissipation structure provided by the embodiment of the present application. As shown in FIG. 13, the upper surface of the plating layer 1 is flush with the upper surface of the plastic package structure 11, i.e., the upper surface of the third metal layer 5 is flush with the upper surface of the plastic package structure 11.

Figure 14:
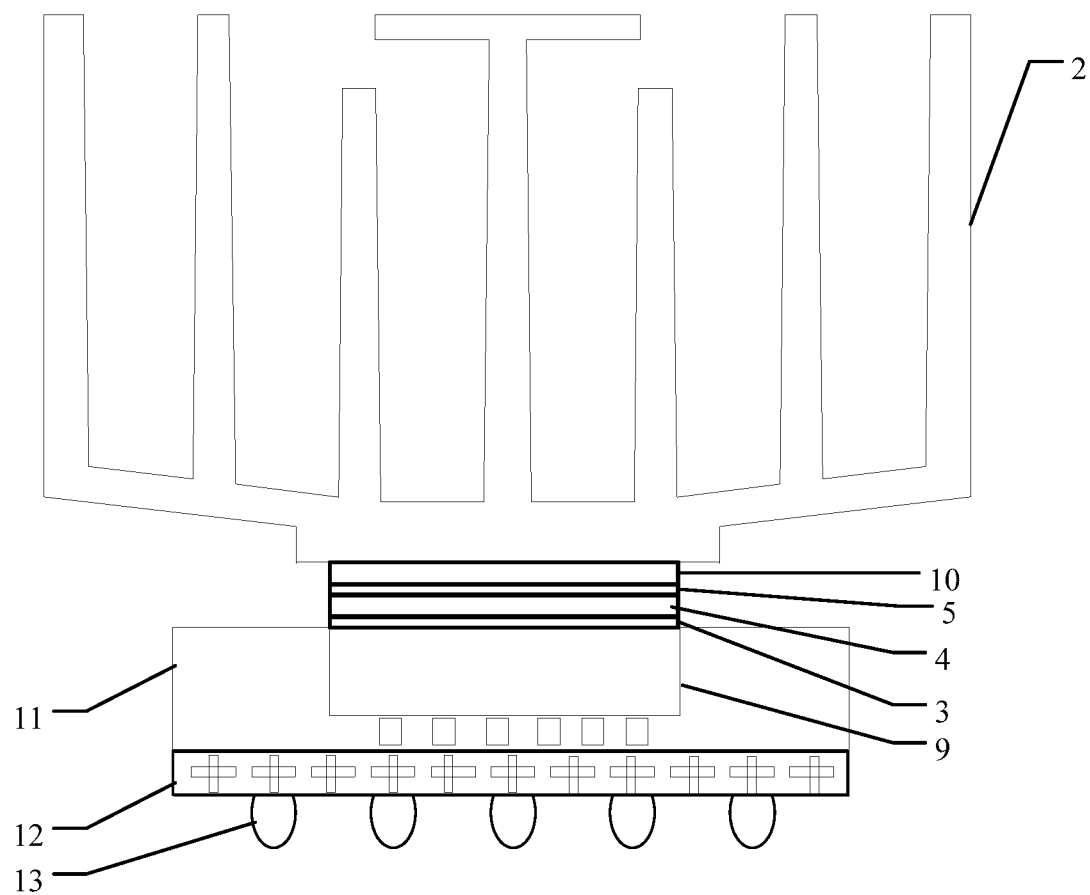
FIG. 14 is a ninth structural schematic diagram of another chip heat dissipation structure provided by the embodiment of the present application.

A second implementation for the positional relationship between the plating layer 1 and the plastic package structure 11: FIG. 14 is a ninth structural schematic diagram of another chip heat dissipation structure provided by the embodiment of the present application. As shown in FIG. 14, the lower surface of the plating layer 1 is flush with the upper surface of the plastic package structure 11, i.e., the lower surface of the first metal layer 3 is flush with the upper surface of the plastic package structure 11.

In the present embodiment, a process of obtaining the chip heat dissipation structure is as follows.

A first step, mental layer setting.

Figure 15:
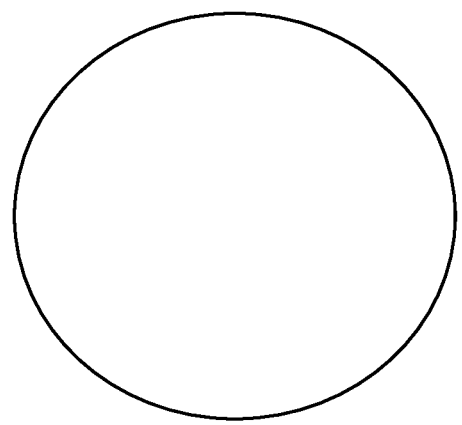
FIG. 15 is a structural schematic diagram of a wafer provided by an embodiment of the present application.

FIG. 15 is a structural schematic diagram of a wafer provided by an embodiment of the present application. As shown in FIG. 15, firstly, electroplating processing is performed on a back surface of the wafer 9 to electroplate the first metal layer 3 on the back surface of the wafer 9; then, the second metal layer 4 is electroplated on the first metal layer 3; and then, the third metal layer 5 is electroplated on the second metal layer 4.

A second step, wafer cutting.

Figure 16:
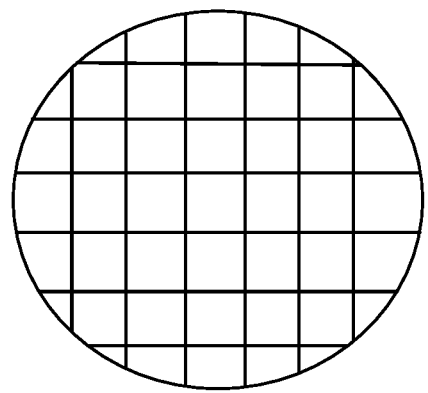
FIG. 16 is a structural schematic diagram of cut wafers provided by the embodiment of the present application.

FIG. 16 is a structural schematic diagram of cut wafers provided by the embodiment of the present application. As shown in FIG. 16, the wafer 9 is cut to obtain the cut wafers 9 as shown in FIG. 16.

A third step, wafer mounting.

Figure 17:
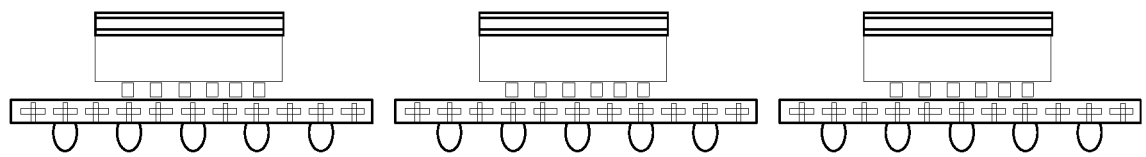
FIG. 17 is a first schematic diagram of a process flow of the chip provided by the embodiment of the present application.

FIG. 17 is a first schematic diagram of a process flow of the chip provided by the embodiment of the present application. As shown in FIG. 17, the cut wafers 9 are respectively mounted on the substrate 12 of each chip.

A fourth step, chip plastic packaging.

Figure 18:
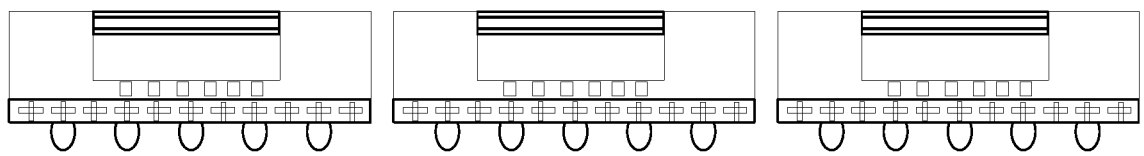
FIG. 18 is a second schematic diagram of a process flow of the chip provided by the embodiment of the present application.

FIG. 18 is a second schematic diagram of a process flow of the chip provided by the embodiment of the present application. As shown in FIG. 18, plastic packaging processing is performed on the wafer 9 on each substrate 12, i.e., the wafer 9 is packaged with the plastic package structure 11.

A fifth step, singulation processing.

Figure 19:
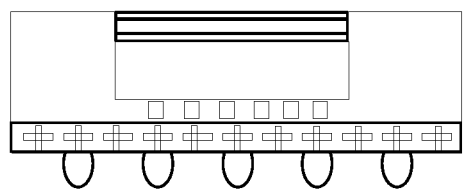
FIG. 19 is a third schematic diagram of a process flow of the chip provided by the embodiment of the present application.

FIG. 19 is a third schematic diagram of a process flow of the chip provided by the embodiment of the present application. As shown in FIG. 19, various chips shown in FIG. 18 are processed by strip singulation (Strip Singulation) processing to obtain each chip.

A sixth step, solder welding.

The solder layer 10 may be arranged on the third metal layer 5 of the plating layer 1, and then the heat sink 2 is welded with the solder layer 10.

In the present embodiment, a chip heat dissipation structure composed of a plating layer 1 is provided, the chip heat dissipation structure is arranged on a chip, the plating layer 1 covers a wafer 9 of the chip, and a heat sink 2 is welded on the plating layer 1 through a solder layer 10; where the plating layer 1 includes a first metal layer 3, a second metal layer 4, and a third metal layer 5 sequentially arranged; and the first metal layer 3 covers the wafer 9, the second metal layer 4 covers the first metal layer 3, and the third metal layer 5 covers the second metal layer 4; in addition, the heat sink 2 may be connected with the plating layer 1. Three metal layers are added on a top of the chip by physical sputtering, so that the heat sink 2 can be welded on the metal layers by a solder layer, and then the heat sink 2 is fixed on the top of the chip; a main component of the solder layer is metal tin, and the metal layer have a higher thermal conductivity than an epoxy adhesive material mounted on a conventional heat sink, which solves a problem of a bottleneck of heat dissipation of the adhesive material in the chip; the metal layers and the solder layer 10 further accelerate heat dissipation of the chip; and heat dissipation effect of the chip can be improved and a large amount of heat can be prevented from damaging the chip.

Figure 20:
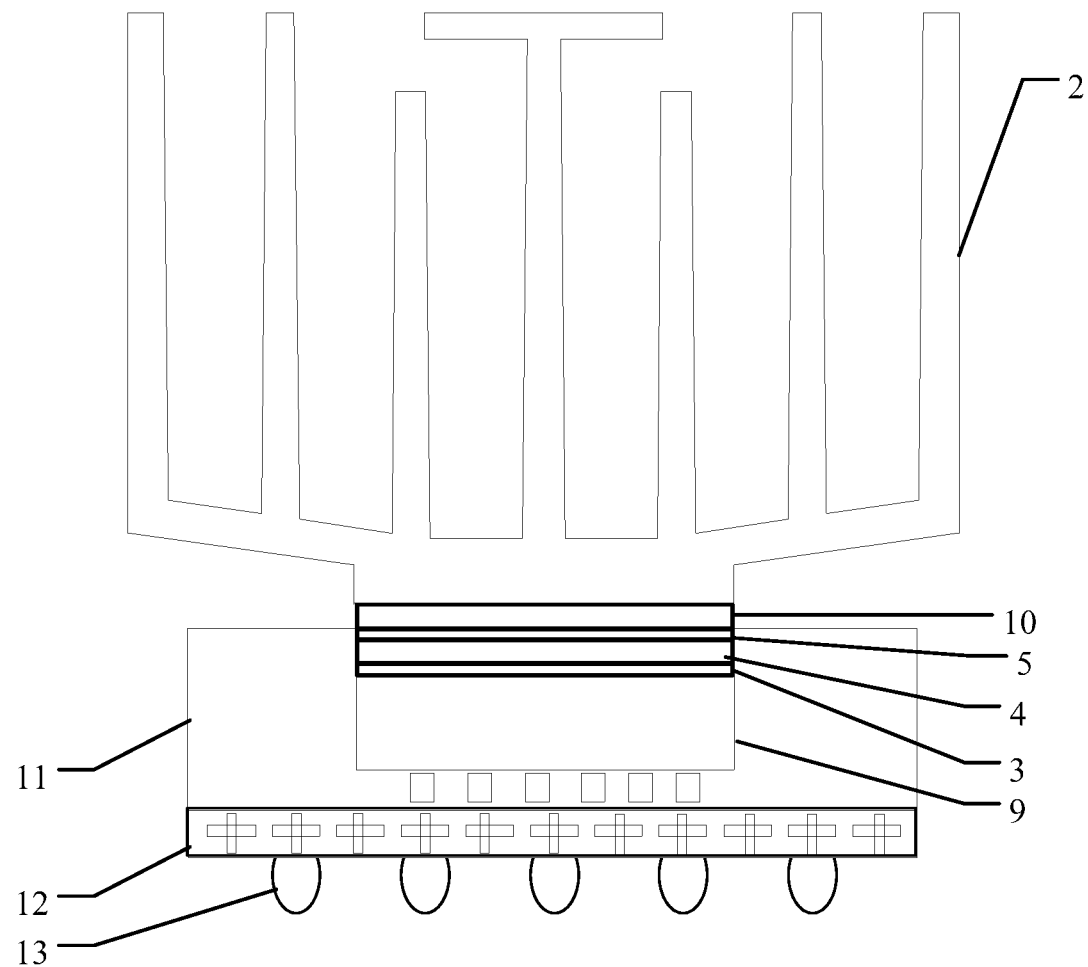
FIG. 20 is a first structural schematic diagram of a chip structure provided by an embodiment of the present application.
Figure 21:
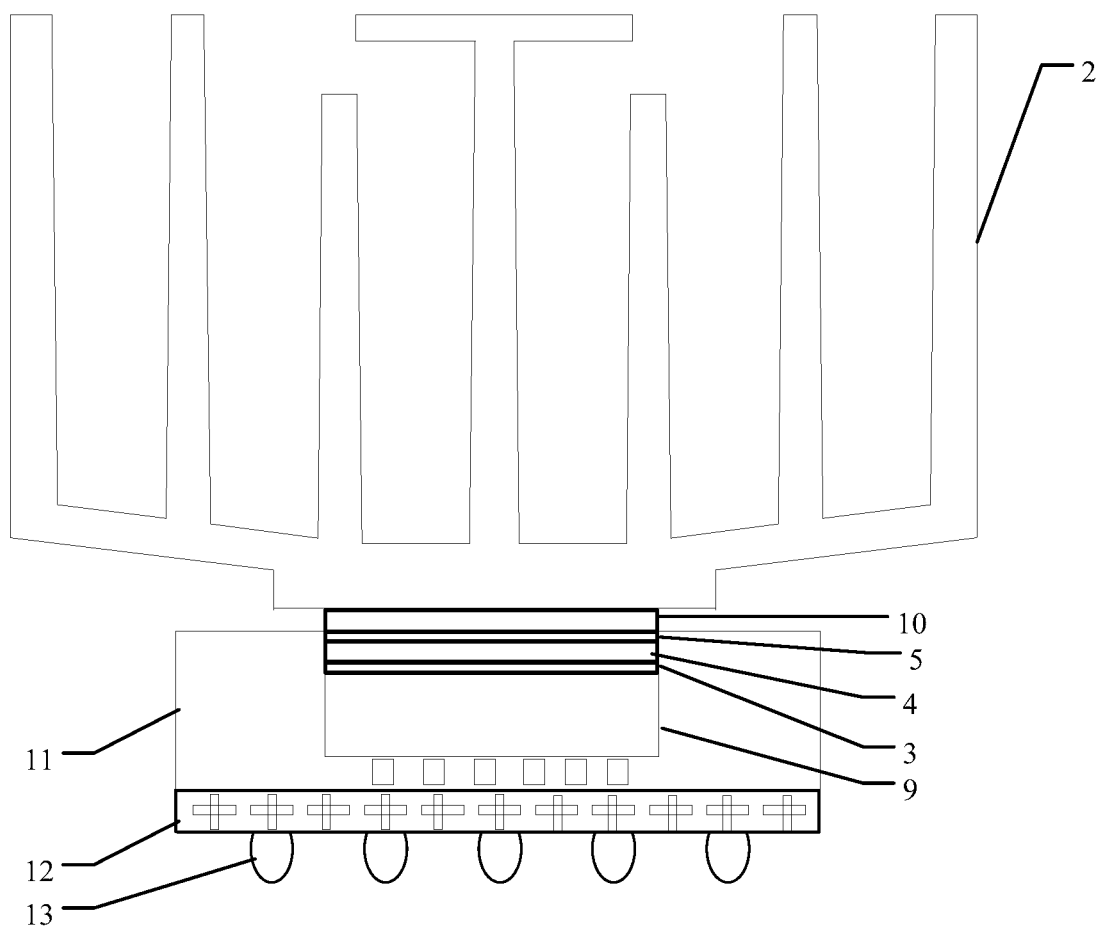
FIG. 21 is a second structural schematic diagram of the chip structure provided by the embodiment of the present application.

FIG. 20 is a first structural schematic diagram of a chip structure provided by an embodiment of the present application; and FIG. 21 is a second structural schematic diagram of the chip structure provided by the embodiment of the present application. As shown in FIGS. 20 and 21, the chip structure includes a chip body and a chip heat dissipation structure arranged on the chip body, where the chip heat dissipation structure adopts the chip heat dissipation structure provided by the above embodiments.

For example, the chip body includes a wafer 9, a plastic package structure 11, and a substrate 12; a groove is formed in the plastic packaging structure 11, the wafer 9 may be arranged in the groove, then the plastic package structure 11 encapsulates the wafer 9, and an upper surface of the wafer 9 is exposed; the plastic package structure 11 is fixedly arranged on one side of the substrate 12; in addition, at least one solder ball 13 may be arranged on the other side of the substrate 12, and the solder ball 13 is used to connect with a circuit board, thereby fixing the chip on the circuit board.

Then, the chip heat dissipation structure provided in the above embodiments is arranged on the wafer 9 of the chip body. A structure and a principle of the chip heat dissipation structure may be referred to the above embodiments, which will not be described in detail.

In the present embodiment, at least one hole may be formed in the plastic package structure 11; and one or more of the at least one hole are provided with a heat conducting structure. Optionally, the heat conducting structure is a metal heat conducting structure or a nonmetal heat conducting structure. Therefore, by opening a hole in the plastic package structure 11 and arranging a heat conducting structure in the hole, heat of the chip structure is further dissipated.

For example, a material of the metal heat conducting structure includes at least one or more of copper, aluminum, silver, tin, gold, iron, and aluminum alloy. A material of the nonmetal heat conducting structure includes at least one or more of resin, ceramics, graphite, graphene, and water.

In the present embodiment, the chip heat dissipation structure provided in the above embodiments is arranged on the wafer 9 of the chip body. A chip heat dissipation structure composed of a plating layer is provided, the chip heat dissipation structure is arranged on a chip, the plating layer covers a wafer of the chip, and a heat sink is connected with the plating layer; where the plating layer includes a first metal layer, a second metal layer, and a third metal layer sequentially arranged; in addition, the heat sink may be connected with the plating layer. Three metal layers are added on a top of the chip by physical sputtering, so that the heat sink can be welded on the metal layers by a solder layer, and then the heat sink is fixed on the top of the chip; a main component of the solder layer is metal tin, and the metal layer have a higher thermal conductivity than an epoxy adhesive material mounted on a conventional heat sink, which solves a problem of a bottleneck of heat dissipation of the adhesive material in the chip; and heat dissipation effect of the chip can be improved and a large amount of heat can be prevented from damaging the chip.

Figure 22:
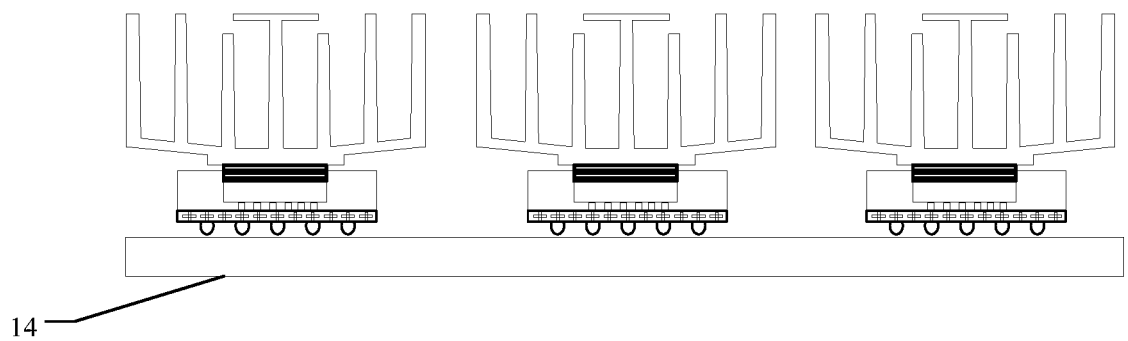
FIG. 22 is a structural schematic diagram of a circuit board provided by an embodiment of the present application.

FIG. 22 is a structural schematic diagram of a circuit board provided by an embodiment of the present application. As shown in FIG. 22, the circuit board 14 of the embodiment of the present application is provided with at least one chip structure provided in the above embodiment.

For example, the circuit board 14 is provided with at least one chip structure provided in the above embodiment, the chip structure being fixedly connected with the solder ball and the circuit board 14.

A position and a number of the chip structure on the circuit board 14 is not limited. For example, at least one chip structure may be arranged on an upper surface of the circuit board 14; or, at least one chip structure may be arranged on the upper surface of the circuit board 14 and at least one chip structure may be arranged on a lower surface of the circuit board 14.

A specific structure of the chip structure on the circuit board 14 may be the same or different. For example, an upper surface of a plating layer in a chip structure on the circuit board 14 is flush with an upper surface of a plastic package structure, and a lower surface of a plating layer in another chip structure on the circuit board 14 is flush with the upper surface of the plastic package structure.

A structure and a principle of the chip structure may be referred to the above embodiment, which will not be described in detail.

In the present embodiment, at least one chip structure provided in the above embodiment is arranged on the circuit board 14, and the chip heat dissipation structure provided in the above embodiments is arranged on the wafer of the chip structure. A chip heat dissipation structure composed of a plating layer is provided, the chip heat dissipation structure is arranged on a chip, the plating layer covers a wafer of the chip, and a heat sink is connected with the plating layer; where the plating layer includes a first metal layer, a second metal layer, and a third metal layer sequentially arranged; in addition, the heat sink may be connected with the plating layer. Three metal layers are added on a top of the chip by physical sputtering, so that the heat sink can be welded on the metal layers by a solder layer, and then the heat sink is fixed on the top of the chip; a main component of the solder layer is metal tin, and the metal layer have a higher thermal conductivity than an epoxy adhesive material mounted on a conventional heat sink, which solves a problem of a bottleneck of heat dissipation of the adhesive material in the chip; and heat dissipation effect of the chip can be improved and a large amount of heat can be prevented from damaging the chip. Further, heat dissipation is performed on the circuit board 14 to prevent heat from damaging the circuit board 14 and components on the circuit board 14.

Figure 23:
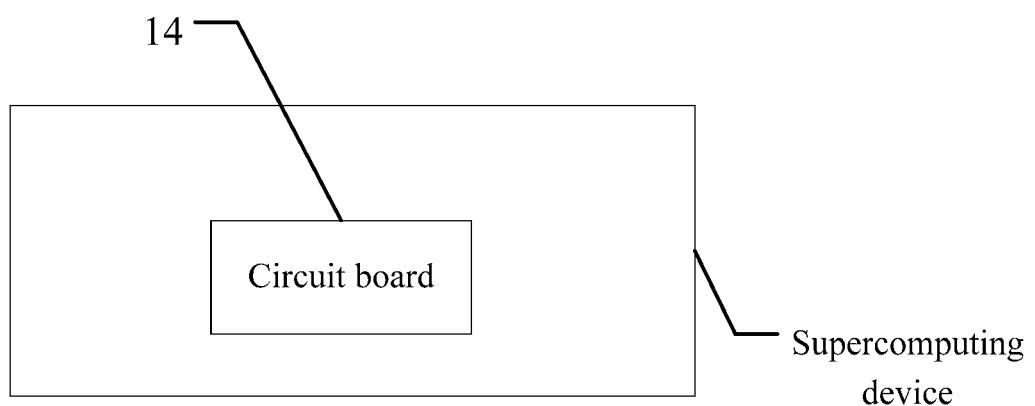
FIG. 23 is a structural schematic diagram of a supercomputing device provided by an embodiment of the present application.

FIG. 23 is a structural schematic diagram of a supercomputing device provided by an embodiment of the present application. As shown in FIG. 23, the supercomputing device provided by the embodiment of the present application is provided with at least one circuit board 14 provided in the above embodiment.

Optionally, circuit boards 14 in the supercomputing device are connected in parallel.

Optionally, a chassis of the supercomputing device may be provided with a sliding groove for sliding connection with the circuit boards 14 in the supercomputing device.

Optionally, fans may further be arranged on both sides of the chassis of the supercomputing device, and heat dissipation channels of the fans may be consistent with a heat dissipation cavity of the heat sink on the circuit board 14, so that heat generated by the circuit board 14 in the chassis can be quickly dissipated to the outside of the chassis, thereby providing performance of the supercomputing device.

For example, one or more circuit boards 14 are provided in the supercomputing device, and the circuit board 14 provided in the above embodiment is adopted. A structure and a function of the circuit board 14 may be referred to an introduction of the above embodiment, which will not be described in detail.

In the present embodiment, a plurality of circuit boards 14 may be connected in parallel, and then the parallel circuit boards 14 may be installed in the supercomputing device. In an embodiment, the supercomputing device may be a supercomputing server.

A connection mode between the circuit board 14 and the supercomputing device may be a fixed connection or a sliding connection. For example, one or more sliding grooves may be arranged on the chassis of the supercomputing device, and then the circuit board 14 is arranged in the sliding grooves, so that the circuit board 14 can slide on the sliding grooves.

When a plurality of circuit boards 14 are arranged in the supercomputing device, a structure of each circuit board 14 in the plurality of circuit boards 14 may be the same or different.

Each circuit board 14 is provided with at least one chip structure provided in the above embodiment, and the chip structure is fixedly connected with the solder ball and the circuit board 14.

A structure and a principle of the chip structure may be referred to the above embodiment, which will not be described in detail.

In the present embodiment, the supercomputing device with one or more circuit boards 14 provided in the above embodiment is provided, at least one chip structure provided in the above embodiment is arranged on each circuit board 14, and the chip heat dissipation structure provided in the above embodiments is arranged on the wafer of the chip structure. A chip heat dissipation structure composed of a plating layer is provided, the chip heat dissipation structure is arranged on a chip, the plating layer covers a wafer of the chip, and a heat sink is connected with the plating layer; where the plating layer includes a first metal layer, a second metal layer, and a third metal layer sequentially arranged; in addition, the heat sink may be connected with the plating layer. Three metal layers are added on a top of the chip by physical sputtering, so that the heat sink can be welded on the metal layers by a solder layer, and then the heat sink is fixed on the top of the chip; a main component of the solder layer is metal tin, and the metal layer have a higher thermal conductivity than an epoxy adhesive material mounted on a conventional heat sink, which solves a problem of a bottleneck of heat dissipation of the adhesive material in the chip; and heat dissipation effect of the chip can be improved and a large amount of heat can be prevented from damaging the chip. Further, heat dissipation is performed on the circuit board 14 to prevent heat from damaging the circuit board 14 and components on the circuit board 14.

When used in the present application, although terms "first", "second", etc. may be used in the present application to describe various elements, these elements should not be limited by these terms. These terms are only used to distinguish one element from another. For example, without changing meaning of a description, a first element may be called a second element, and similarly, the second element may be called the first element as long as all present "first element" is renamed uniformly and all present "second element" is renamed uniformly. The first element and the second element are both elements, but may not be a same element.

Words used in the present application are only used to describe the embodiments and are not used to limit claims. As used in a description of the embodiments and claims, unless a context clearly indicates, singular forms "a", "an", and "the" are intended to include plural forms as well. Similarly, a term "and/or" as used in the present application is meant to contain one or more any and all possible combinations which are associated and listed. In addition, when used in the present application, a term "comprise" and its variants "comprises" and/or "comprising", etc., refer to presence of a feature, an integer, a step, an operation, an element, and/or a component which are stated, but do not exclude one or more other features, integers, steps, operations, elements, and/or components Various aspects, implementations, achievement, or features in the described embodiments may be used alone or in any combination.

The above technical description may refer to the drawings, the drawings forming a part of the present application, and implementations according to the described embodiments are shown by way of description. Although these embodiments are described in sufficient detail to enable persons of skill in the art to implement these embodiments, these embodiments are nonrestrictive; in this way, other embodiments may be used and changes may be made without departing from scope of the described embodiments. For example, a sequence of operations described in a flowchart is nonrestrictive, thus a sequence of two or more operations illustrated in the flowchart and described according to the flowchart may be changed according to several embodiments. As another example, in several embodiments, one or more operations illustrated in the flowchart and described according to the flowchart are optional or may be deleted. In addition, some steps or functions may be added to the disclosed embodiments, or a sequence of more than two steps may be replaced. All such changes are considered to be contained in the disclosed embodiments and claims.

In addition, terms are used in the above technical description to provide a thorough understanding of the described embodiments. However, too much detail is not required to implement the described embodiments. Therefore, the above descriptions of the embodiments are presented for illustration and description. The embodiments presented in the above descriptions and examples disclosed according to these embodiments are provided separately to add a context and help to understand the described embodiments. The above specification is not intended to be exhaustive or to limit the described embodiments to a precise form of the present application. According to the above teachings, several modifications, alternative applications, and changes are feasible. In some cases, well-known processing steps are not described in detail to avoid unnecessarily affecting the described embodiments.

What is claimed is:

1. A chip heat dissipation structure, arranged on a chip, wherein the chip heat dissipation structure comprises: a plating layer covering a wafer of the chip;
   wherein the plating layer comprises a first metal layer, a second metal layer, and a third metal layer sequentially arranged;
   wherein the chip heat dissipation structure further comprises: a heat sink connected with the plating layer;
   wherein the heat sink is welded on the plating layer through a solder layer;
   wherein solder in the solder layer is tin.

2. The chip heat dissipation structure according to claim 1, wherein the first metal layer covers the wafer, the second metal layer covers the first metal layer, and the third metal layer covers the second metal layer.

3. The chip heat dissipation structure according to claim 1, wherein the chip comprises the wafer and a plastic package structure, and an upper surface of the wafer is exposed.

4. The chip heat dissipation structure according to claim 1, wherein an area of the plating layer is the same as an area of an upper surface of the wafer.

5. The chip heat dissipation structure according to claim 1, wherein the first metal layer is a titanium metal layer.

6. The chip heat dissipation structure according to claim 5, wherein a thickness of the first metal layer is 1000 angstroms.

7. The chip heat dissipation structure according to claim 1, wherein the second metal layer is a nickel-vanadium alloy metal layer.

8. The chip heat dissipation structure according to claim 7, wherein a thickness of the second metal layer is 3500 angstroms.

9. The chip heat dissipation structure according to claim 1, wherein the third metal layer is made of gold.

10. The chip heat dissipation structure according to claim 9, wherein a thickness of the third metal layer is 1000 angstroms.

11. The chip heat dissipation structure according to claim 1, wherein areas of the first metal layer, the second metal layer, and the third metal layer are the same.

12. The chip heat dissipation structure according to claim 1, wherein a thickness of the solder layer is 0.1 to 0.15 mm.

13. The chip heat dissipation structure according to claim 1, wherein an area of the solder layer is the same as an area of the plating layer, or the area of the solder layer is the same as an area of a lower surface of the heat sink.

14. The chip heat dissipation structure according to claim 3, wherein an upper surface of the plating layer is flush with an upper surface of the plastic package structure, or a lower surface of the plating layer is flush with the upper surface of the plastic package structure.

15. A chip structure, comprising a chip body and the chip heat dissipation structure according to claim 1, which is arranged on the chip body.

16. A circuit board, wherein the circuit board is provided with at least one chip structure according to claim 15.

17. A supercomputing device, wherein the supercomputing device is provided with at least one circuit board according to claim 16.

* * * * *